US011749672B2

(12) United States Patent
Mahajan et al.

(10) Patent No.: US 11,749,672 B2
(45) Date of Patent: Sep. 5, 2023

(54) DEVICE FOR ELECTROSTATIC DISCHARGE PROTECTION

(71) Applicant: GLOBALFOUNDRIES Singapore Pte. Ltd., Singapore (SG)

(72) Inventors: Prantik Mahajan, Singapore (SG); Aloysius Priartanto Herlambang, Singapore (SG); Kyong Jin Hwang, Singapore (SG); Robert John Gauthier, Jr., Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/471,190

(22) Filed: Sep. 10, 2021

(65) Prior Publication Data

US 2023/0085420 A1    Mar. 16, 2023

(51) Int. Cl.

| H01L 27/02 | (2006.01) |
|---|---|
| H01L 27/06 | (2006.01) |
| H01L 21/762 | (2006.01) |
| H01L 21/8224 | (2006.01) |

(52) U.S. Cl.
CPC .... *H01L 27/0248* (2013.01); *H01L 21/76202* (2013.01); *H01L 21/76224* (2013.01); *H01L 21/8224* (2013.01); *H01L 27/067* (2013.01); *H01L 27/0658* (2013.01); *H01L 27/0664* (2013.01)

(58) Field of Classification Search
CPC .......... H01L 27/0248; H01L 21/76202; H01L 21/76224; H01L 21/8224; H01L 27/0658; H01L 27/0664; H01L 27/067; H01L 29/87; H01L 27/0262
See application file for complete search history.

(56) References Cited

U.S. PATENT DOCUMENTS

| 2014/0252470 A1* | 9/2014 | Chen ................. H01L 29/66659 438/234 |
| 2018/0145065 A1 | 5/2018 | Holland et al. |
| 2020/0098741 A1 | 3/2020 | Zeng |

OTHER PUBLICATIONS

Zeng et al., "A Novel HV-NPN ESD Protection Device with Buried Floating P-Type Implant", 2019 IEEE International Reliability Physics Symposium (IRPS), 2019, 4 pages, IEEE.

* cited by examiner

*Primary Examiner* — Julia Slutsker
(74) *Attorney, Agent, or Firm* — VIERING JENTSCHURA & PARTNER MBB

(57) ABSTRACT

A device includes a first region, a second region disposed on the first region, a third region and a fourth region abutting the third region disposed in the second region, a fifth region disposed in the third region and coupled to a collector disposed above, and a sixth region disposed in the fourth region and coupled to an emitter disposed above. A first isolation is disposed between the collector and the emitter. A seventh region is disposed in the fifth region and coupled to the collector is spaced apart from the first isolation. The first region, the third region, the fifth region, the collector and the emitter have a first conductivity type different from a second conductivity type that the second region, the fourth region, the sixth region and the seventh region have.

20 Claims, 12 Drawing Sheets

DEVICE FOR ELECTROSTATIC DISCHARGE PROTECTION

TECHNICAL FIELD

The present disclosure relates generally to electrostatic discharge (ESD) protection devices.

BACKGROUND

An ESD protection device protects a functional circuit from an electrostatic discharge, in order to prevent a malfunction or breakdown of a victim electronic device.

There is a need to enhance the overall ESD robustness for applications including Automotive Grade application and to optimize the safe ESD Design Window for High-voltage applications.

SUMMARY

According to an aspect of the present disclosure, there is provided a device including: a first region; a second region disposed on the first region; a third region and a fourth region disposed in the second region, wherein the third region abuts the fourth region; a fifth region disposed in the third region and a sixth region disposed in the fourth region; a collector region disposed over and coupled to the fifth region; an emitter region disposed over and coupled to the sixth region; a first isolation region disposed between the collector region and the emitter region; and a seventh region disposed in the fifth region and coupled to the collector region, wherein the seventh region is spaced apart from the first isolation region, wherein the first region, the third region, the fifth region, the collector region and the emitter region have a first conductivity type; wherein the second region, the fourth region, the sixth region, and the seventh region have a second conductivity type; and wherein the first conductivity type is different from the second conductivity type.

According to an aspect of the present disclosure, there is provided a method for manufacturing a device, including: providing a first region on a substrate; providing a second region on the first region; providing a third region and a fourth region in the second region, wherein the third region abuts the fourth region; providing a fifth region disposed in the third region; providing a sixth region disposed in the fourth region; providing a seventh region disposed in the fifth region; providing a collector region over and coupled with the fifth region and the seventh region; providing an emitter region and a base region over and coupled with the sixth region; providing a first isolation region between the collector region and the emitter region, extending across over the fifth region, the third region, the fourth region and the sixth region; and providing a second isolation region between the emitter region and the base region, wherein the seventh region is configured to be spaced apart from the first isolation region; and wherein the first region, the third region, the fifth region, the collector region and the emitter region have a first conductivity type; wherein the second region, the fourth region, the sixth region, the base region and the seventh region have a second conductivity type; and wherein the first conductivity type is different from the second conductivity type.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same features throughout the different drawings. Also, the drawings are not necessarily to scale, emphasis instead generally being placed upon illustrating the principles of the disclosure. Embodiments of the disclosure will now be illustrated for the sake of example only with reference to the following drawings, in which.

DETAILED DESCRIPTION

Figure 1:
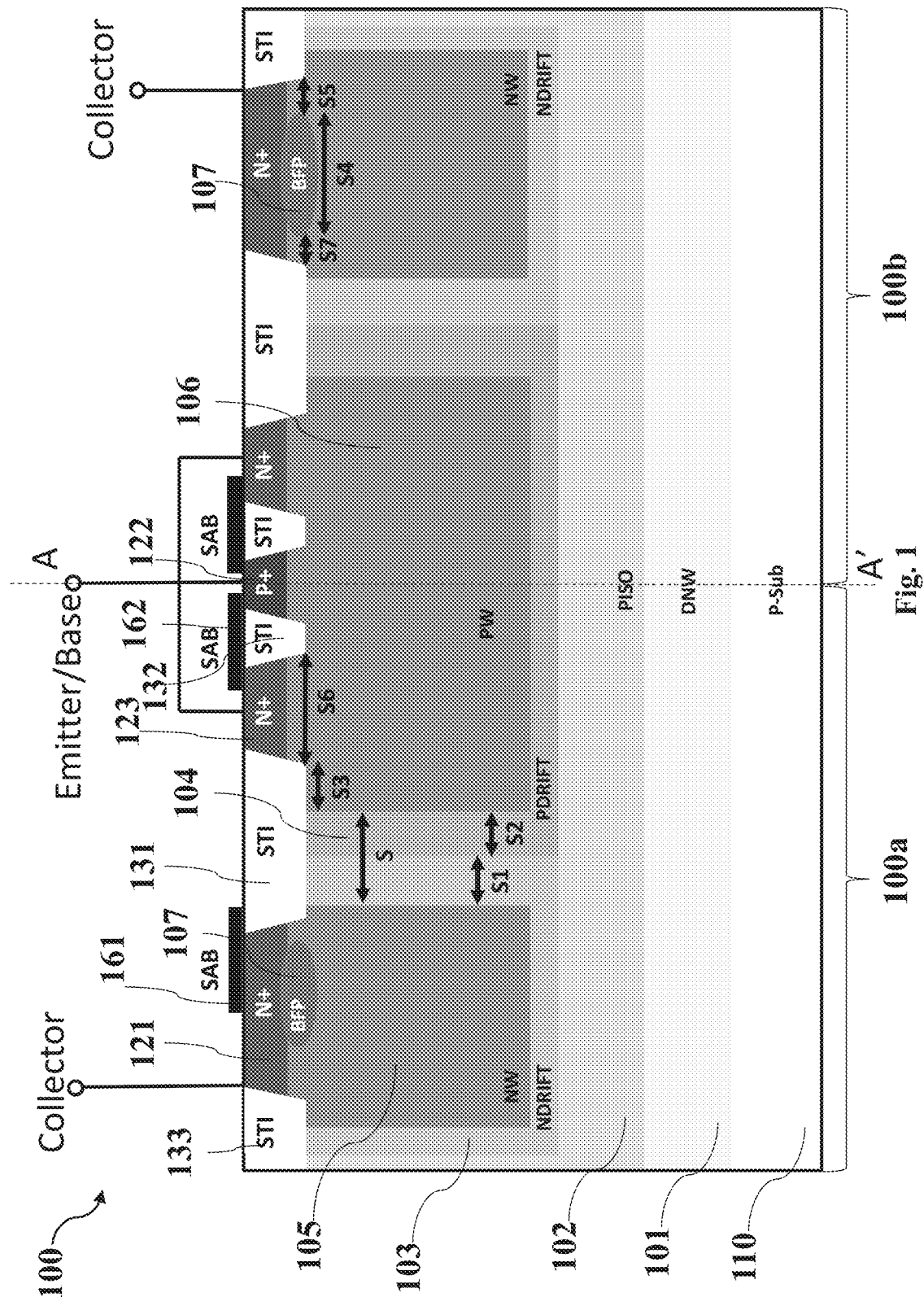
FIG. 1 shows a cross-sectional view of a device for ESD protection according to an embodiment of the present disclosure.

Embodiments generally relate to semiconductor devices. More particularly, some embodiments relate to electrostatic discharge (ESD) protection devices, such as silicon controlled rectifiers (SCRs). Such ESD protection devices, for example, may be incorporated into integrated circuits (ICs). The devices or ICs may be incorporated into or used with, for example, consumer and automotive electronic products, or related to other types of devices.

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the disclosure, are given by way of illustration only, and are not by way of limitation. Various substitutions, modifications, additions, and/or arrangements, within the spirit and/or scope of the underlying inventive concepts will be apparent to those skilled in the art from this disclosure.

The non-limiting embodiments described below in context of the devices are analogously valid for the respective methods, and vice versa. Furthermore, it will be understood that the embodiments described below may be combined; for example, a part of one embodiment may be combined with a part of another embodiment.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. The word "or" is intended to include "and" unless the context clearly indicates otherwise.

The terminology used herein is for the purpose of describing particular examples only and is not intended to be limiting of the disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

It should be understood that the terms "on", "over", "top", "bottom", "down", "side", "back", "left", "right", "front", "lateral", "vertical", "side", "up", "down" etc., when used in the following description are used for convenience and to aid understanding of relative positions or directions, and not intended to limit the orientation of any device, or structure or any part of any device or structure. Similarly, the term "in" as used herein is not intended to limit a thing to be fully enclosed by something else. Further, the term "width" is intended to mean a length extending in the lateral direction with reference to the relevant drawings; the term "depth" is intended to mean a length extending in the vertical direction with reference to the relevant drawings.

As used herein, the term "connected," when used to refer to two physical elements, means a direct connection between the two physical elements. The term "coupled," however, can mean a direct connection or a connection through one or more intermediary elements. The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

According to various non-limiting embodiments, a device may include: a first region; a second region disposed on the first region; a third region and a fourth region disposed in the second region, wherein the third region abuts the fourth region; a fifth region disposed in the third region and a sixth region disposed in the fourth region; a collector region disposed over and coupled to the fifth region; an emitter region disposed over and coupled to the sixth region; a first isolation region disposed between the collector region and the emitter region; and a seventh region disposed in the fifth region and coupled to the collector region, wherein the seventh region is spaced apart from the first isolation region, wherein the first region, the third region, the fifth region, the collector region and the emitter region have a first conductivity type; wherein the second region, the fourth region, the sixth region, and the seventh region have a second conductivity type; and wherein the first conductivity type is different from the second conductivity type.

According to various non-limiting embodiments, the first isolation may extend across and over the fifth region, the third region, the fourth region and the sixth region.

According to various non-limiting embodiments, the device may further comprise a second isolation region abutting the collector region and disposed across and over the second region, the third region and the fifth region.

According to various non-limiting embodiments, the seventh region may be configured to be spaced apart from the second isolation region.

According to various non-limiting embodiments, the second isolation region abutting the collector region may comprise the second isolation region in direct contact with the collector region.

According to various non-limiting embodiments, a first terminal region having the second conductivity type may be provided over the fifth region and positioned between the collector region and the first isolation region, the first terminal region being configured to be spaced apart from the collector region and to abut the first isolation region.

According to various non-limiting embodiments, the seventh region may be spaced apart from the first terminal region.

According to various non-limiting embodiments, the first terminal region being configured to abut the first isolation region may comprise the first terminal region being configured to be in direct contact with the first isolation region.

According to various non-limiting embodiments, the device may further comprise a salicide block layer disposed over the collector region, the fifth region, the first terminal region and the first isolation region.

According to various non-limiting embodiments, the device may further comprise a third isolation region disposed over the second region; and a second terminal region having the second conductivity type disposed between the second isolation region and the third isolation region, and disposed in the second region, and a metal component may be provided on the second terminal region and connected through a series resistance to ground.

According to various non-limiting embodiments, the device may further comprise a base region disposed over and in direct contact with the sixth region, and a fourth isolation region disposed over the sixth region and positioned between the emitter region and the base region, and the fourth isolation region may be spaced apart from the first isolation region.

According to various non-limiting embodiments, the third region abutting the fourth region may comprise the third region in direct contact with the fourth region; and the collector region coupled to the fifth region may comprise the collector region in direct contact with the fifth region, the emitter region coupled to the sixth region may comprise the emitter region in direct contact with the sixth region, and the seventh region coupled to the collector region may comprise the seventh region in direct contact with the collector region.

According to various non-limiting embodiments, a doping concentration of the seventh region may be greater than a doping concentration of the sixth region, and the doping concentration of the sixth region may be greater than a doping concentration of the fourth region, and the doping concentration of the fourth region may be greater than a doping of the second region; and a doping concentration of the fifth region may be greater than a doping concentration of the third region, and the doping concentration of the third region may be greater than a doping concentration of the first region.

According to various non-limiting embodiments, the fifth region may be disposed away from a boundary between the third region and the fourth region, and the sixth region may be disposed away from the boundary between the third region and the fourth region.

According to various non-limiting embodiments, the first conductivity type may be opposite to the second conductivity type.

According to various non-limiting embodiments, the first region may be a well region; and the second region may be a doped isolation layer, extending continuously over the first region.

According to various non-limiting embodiments, the third region and the fourth region may be drift regions.

According to various non-limiting embodiments, the third region may be disposed at a substantially same depth at which the fourth region is disposed in the second region.

According to various non-limiting embodiments, the fifth region may be disposed in the third region at a substantially same depth at which the sixth region is disposed in the fourth region.

According to various non-limiting embodiments, there may be provided a method for manufacturing a device, including: providing a first region on a substrate; providing a second region on the first region; providing a third region and a fourth region in the second region, wherein the third region abuts the fourth region; providing a fifth region disposed in the third region; providing a sixth region disposed in the fourth region; providing a seventh region disposed in the fifth region; providing a collector region over and coupled with the fifth region and the seventh region; providing an emitter region and a base region over and coupled with the sixth region; providing a first isolation region between the collector region and the emitter region, extending across over the fifth region, the third region, the fourth region and the sixth region; and providing a second isolation region between the emitter region and the base region, wherein the seventh region is configured to be spaced apart from the first isolation region; and wherein the first region, the third region, the fifth region, the collector region and the emitter region have a first conductivity type; wherein the second region, the fourth region, the sixth region, the base region and the seventh region have a second conductivity type; and wherein the first conductivity type is different from the second conductivity type.

FIG. 1 shows a cross-sectional view of a device 100 for an electrostatic discharge (ESD) protection according to an embodiment of the present disclosure. The device 100 may include a first conductivity region 101 disposed on a substrate 110, a second conductivity region 102 disposed on the first conductivity region 101. The first conductivity region 101 may be an n-doped well region suitable for high voltage application. The second conductivity region 102 may be a p-doped isolation layer, extending continuously over the first conductivity region 101. The second conductivity region 102 therefore isolates other conductivity regions disposed thereabove as introduced later from the first conductivity region 101. The device 100 may further include a third conductivity region 103 and a fourth conductivity region 104 disposed in the second conductivity region 102. The third conductivity region 103 and the fourth conductivity region 104 may be partially or fully within the second conductivity region 102. The third conductivity region 103 may laterally abut the fourth conductivity region 104. A vertical boundary of the third conductivity region 103 may be extended continuously along a vertical boundary of the fourth conductivity region 104. The third conductivity region 103 may be in direct lateral contact with the fourth conductivity region 104 along the entirety of the vertical boundaries. In a non-limiting alternative embodiment, the third conductivity region 103 may be in direct lateral contact with the fourth conductivity region 104 along a part of the vertical boundaries. The third conductivity region 103 and the fourth conductivity region 104 may be drift regions. The drift regions are provided to increase the breakdown voltages with graded junction design. The third conductivity region 103 may be disposed at a substantially same depth at which the fourth conductivity region 104 is disposed in the second conductivity region 102. In an alternative embodiment, the third conductivity region 103 may be disposed at a different depth at which the fourth conductivity region 104 is disposed in the second conductivity region 102. As used herein, the "substantially same" may include "absolutely the same" and "about the same within a reasonable range".

The device 100 may also include a fifth conductivity region 105 disposed in the third conductivity region 103 and a sixth conductivity region 106 disposed in the fourth conductivity region 104. The fifth conductivity region 105 may be partially or fully within the third conductivity region 103. The sixth conductivity region 106 may be partially or fully within the fourth conductivity region 104. The fifth conductivity region 105 may be disposed in the third conductivity region 103 at a substantially same depth at which the sixth conductivity region 106 may be disposed in the fourth conductivity region 104. In an alternative embodiment, the fifth conductivity region 105 may be disposed in the third conductivity region 103 at a different depth at which the sixth conductivity region 106 may be disposed in the fourth conductivity region 104. In this case, the floor depth of the third conductivity region 103 (NDRIFT) is different from the floor depth of the fourth conductivity region 104 (PDRIFT). The fifth conductivity region 105 may be disposed away from the vertical boundary of the third conductivity region 103 at a predetermined distance (denoted as "$S_1$" in FIG. 1), and the sixth conductivity region 106 may be disposed away from the vertical boundary of the fourth conductivity region 104 at a predetermined distance (denoted as "$S_2$" in FIG. 1). The distance $S_1$ may be equal to, less than, or larger than the distance $S_2$. The lateral distance between the third conductivity region 103 and the fourth conductivity region 104 is a sum of $S_1$ and $S_2$ and denoted as "S" in FIG. 1. The distances $S_1$, $S_2$, S may be varied during fabrication so as to adjust the electrical characteristics of the device 100. Further details will be discussed below.

The device 100 may further include a collector region 121 disposed over the fifth conductivity region 105 and an emitter region 123 disposed over the sixth conductivity region 106. The collector region 121 may be coupled to the fifth conductivity region 105 and the emitter region 123 may be coupled to the sixth conductivity region 106. The collector region 121 may be in direct contact with the fifth conductivity region 105, and the emitter region 123 may be in direct contact with the sixth conductivity region 106. The device 100 may also include a base region 122. The base region 122 may be coupled to the sixth conductivity region 106.

The device 100 may include a seventh conductivity region 107 disposed in the fifth conductivity region 105. The seventh conductivity region 107 may be a buried floating p-doped conductivity region and have a width (denoted as "$S_4$" in FIG. 1). The seventh conductivity 107 may be coupled to the collector region 121. The seventh conductivity region 107 may be in direct contact with the collector region 121.

The device 100 may further include the isolation regions 131, 132, 133. The isolation regions may be shallow trench isolation (STI) or local oxidation of silicon (LOCOS) regions and have a cross-section of a trapezoid or a hexagonal prism. The first isolation region 131 may be disposed between the collector region 121 and the emitter region 123, i.e. collector-to-emitter (C-E) STI. The first isolation region 131 may extend across and over the fifth conductivity region 105, the third conductivity region 103, the fourth conductivity region 104 and the sixth conductivity region 106. The second isolation region 132 may be disposed between the emitter region 123 and the base region 122. The second isolation region 132 may be disposed over the sixth conductivity region 106. The third isolation region 133 disposed abutting the collector region 121, and extending across and over the second conductivity region 102, the third conductivity region 103 and the fifth conductivity region 105. The isolation regions 131, 132, 133 may be disposed at a depth greater than the depth at which the collector region 121, the emitter region 123 and the base region 122 are disposed. The first isolation region 131 may be spaced apart from the second isolation region 132 at a predetermined distance (denoted as "$S_6$" FIG. 1), as from the point of the trapezoid of the first isolation region 131 disposed in the sixth conductivity region 106 to one point of the trapezoid of the second isolation region 132 disposed in the sixth conductivity region 106. The first isolation region 131 may be disposed across and over the sixth conductivity region 106 at a predetermined distance (as denoted "$S_3$" in FIG. 1). The distance $S_3$ is defined from the boundary of the sixth conductivity region 106 to the point of the trapezoid of the first isolation region 131 disposed in the sixth conductivity region 106. The seventh conductivity region 107 may be spaced apart from the first isolation region 131 at a predetermined distance (denoted as "$S_7$" in FIG. 1). The distance $S_7$ is defined from one end of the seventh conductivity region 107 to the point of the trapezoid of the first isolation region 131 disposed in the fifth conductivity region 105. The distance $S_7$ can be varied to define parasitic bipolar junction transistor (BJT) lateral PNP $Q_2$ base, and modulate BJT current gain thereby influencing the holding voltage. This will be discussed in the following description.

The seventh conductivity region 107 may be spaced apart from the third isolation region 133 at a predetermined distance (denoted as "$S_5$" in FIG. 1). The distance $S_5$ is defined as from one end of the seventh conductivity region 107 to the point of the trapezoid of the third isolation region 133 disposed in the fifth conductivity region 105. The distance $S_5$ can be varied to adjust the failure current It2 of the device 100, thereby optimizing the ESD robustness performance of the device 100. This will be also discussed in the following description.

The device 100 may optionally further include block layers 161, 162 in the form of salicide block layers (SAB) arranged over the collector region 121, the first isolation region 131, the emitter region 123, the second isolation region 132, and the base region 122. The block layers 161, 162 may be formed of silicon nitride. Each block layer 161, 162 may partially overlap with the respective collector region 121, the emitter region 123. The block layer 162 may partially overlap with the base region 122. Accordingly, the block layers 161, 162 can help guide external current flow (current flow from external of the device 100 e.g. from other parts of the circuit) to the collector region 121, and this may improve the electrostatic discharge (ESD) performance of the device 100.

In a non-limiting embodiment, the substrate 110 may include any silicon-containing substrate including, but not limited to, silicon (Si), single crystal silicon, polycrystalline Si, amorphous Si, silicon-on-sapphire (SOS), silicon-on-insulator (SOI) or silicon-on-replacement insulator (SRI) or silicon germanium substrates and the like. Substrate 110 may in addition or instead include various isolations, dopings and/or device features. The substrate 110 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), gallium nitride (GaN), aluminium nitride (AlN), indium nitride (InN), and/or indium antimonide (InSb) or combinations thereof; an alloy semiconductor including GaAsP, AlInAs, GaInAs, GaInP, AlGaN, or GaInAsP, or combinations thereof.

In a non-limiting embodiment, the device 100 may be conventionally fabricated, for example, using known processes and techniques (e.g., growing epitaxial material and implanting impurities). In one example, the implant material for the emitter region 123, the collector region 121, may be the same implant material, for example implanting phosphorus. For example, the p-type material may be or include, but is not limited to boron doped silicon as a material, and/or the n-type material may be or include, but is not limited to doped silicon material including phosphorus dopants, arsenic dopants, or combinations thereof.

In a non-limiting embodiment, the device 100 may include a first segment 100a and a second segment 100b, and the first segment 100a and the second segment 100b are substantially symmetrical (e.g. symmetrical mirror) images of each other about a vertical axis A-A' through the middle of the device 100. Accordingly, symmetrical features will have the same reference numerals. Similarly, current flows through the first and second segments 100a, 100b of the device 100 may occur in the first segment 100a and the second segment 100b in a symmetrical manner about the vertical axis A-A' through the middle of the device 100. The device 100 may be modified such that it includes only either the first segment 100a or the second segment 100b. The device 100 may be also modified such that it includes multiple segments of 100a and 100b.

Figure 2:
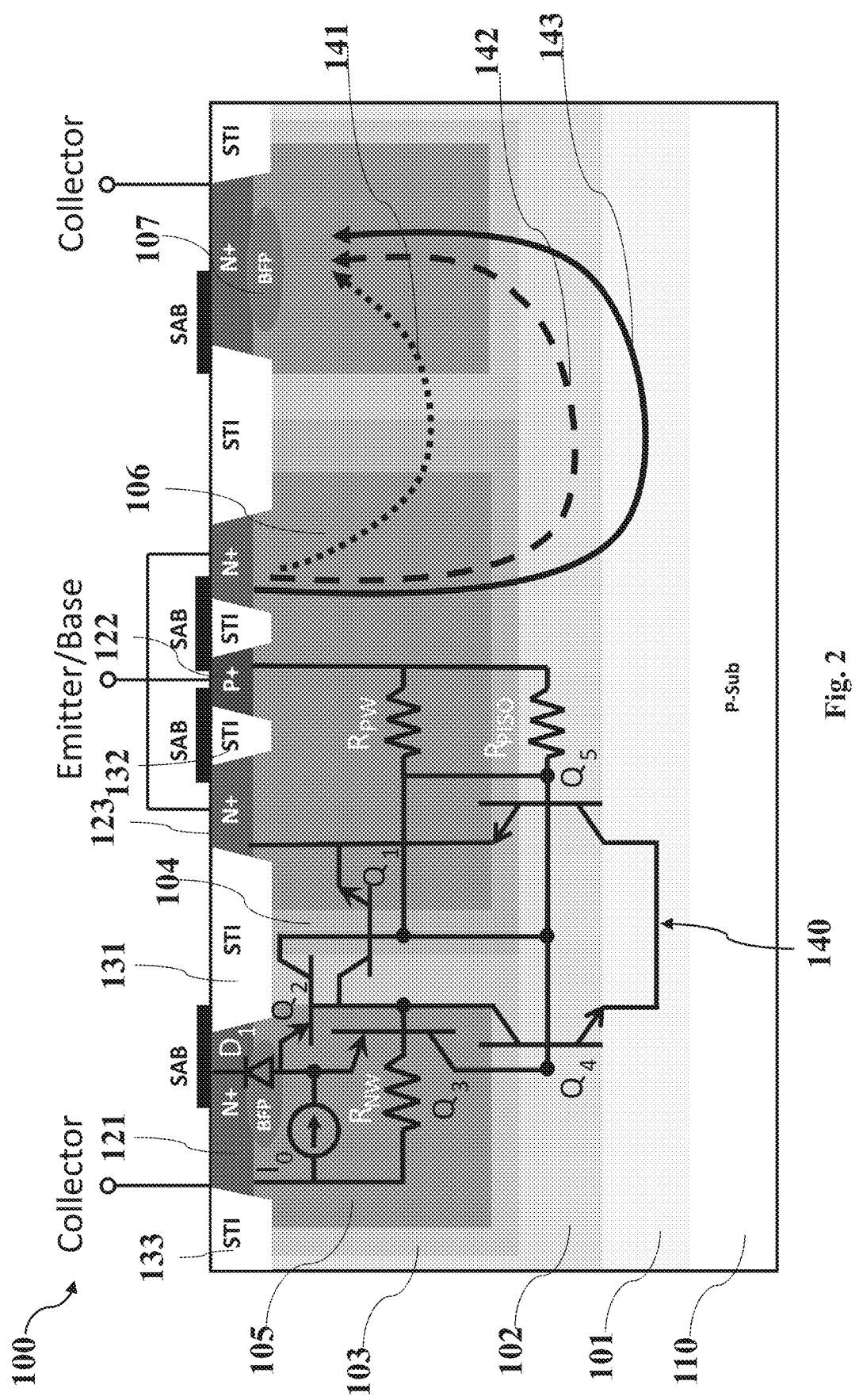
FIG. 2 shows an equivalent circuit of the device of FIG. 1.

FIG. 2 shows an equivalent circuit 140 of the device 100. The emitter region 123, the sixth conductivity region 106, the fourth conductivity region 104 and the third conductivity region 103 of the device 100 forms a lateral parasitic NPN transistor $Q_1$. The fourth conductivity region 104, the third conductivity region 103, the fifth conductivity region 105 and the seventh conductivity region 107 of the device 100 forms a lateral parasitic PNP transistor $Q_2$. The emitter region 123, the sixth conductivity region 106, the fourth conductivity region 104, the third conductivity region 103, the fifth conductivity region 105 and the seventh conductivity region 107 of the device 100 forms a lateral parasitic SCR structure. The seventh conductivity region 107, the fifth conductivity region 105, the third conductivity region 103, the second conductivity region 102 and the first conductivity region 101 of the device 100 forms a vertical parasitic SCR structure with an equivalent circuit of a PNP transistor $Q_3$ and an NPN transistor $Q_4$ connected in regenerative positive feedback mode. The emitter region 123, the sixth conductivity region 106, the fourth conductivity region 104, the second conductivity region 102 and the first conductivity region 101 of the device 100 forms a vertical parasitic structure with equivalent circuit of an NPN transistor $Q_5$. The collector region 121 and the seventh conductivity region 107 of the device 100 forms a parasitic diode $D_1$. The equivalent circuit may also include resistors $R_{NW}$, $R_{PW}$ and $R_{PISO}$ corresponding to the resistance of the fifth conductivity region 105, the sixth conductivity region 106 and the second conductivity region 102, respectively. The resistor $R_{NW}$ may be connected between the diode $D_1$ and the base of the transistor $Q_3$. The resistor $R_{PW}$ may be connected between the emitter and the base of the transistor $Q_1$. The resistor $R_{PISO}$ may be connected between the base and the emitter of the transistor $Q_5$. The second conductivity region 102 provides a continuous high voltage body p-doped well isolation to enable series connected parasitic vertical SCR (vertical PNP $Q_3$ and vertical NPN $Q_4$) and parasitic vertical bipolar (vertical NPN $Q_5$) for NPN-eSCR device action. Accordingly, a deep vertical current path can be formed in the device 100.

A first current path 141 may be formed through the emitter region 123, the sixth conductivity region 106, the fourth conductivity region 104, the third conductivity region 103, the fifth conductivity region 105, the seventh conductivity region 107 and the collector region 121. A second current path 142 may be formed through the emitter region 123, the sixth conductivity region 106, the fourth conductivity region 104, the second conductivity region 102, the third conductivity region 103, the fifth conductivity region 105, the seventh conductivity region 107 and the collector region 121. A third current path 143 may be formed through the emitter region 123, the sixth conductivity region 106, the fourth conductivity region 104, the second conductivity region 102, the first conductivity region 101, the second conductivity region 102, the third conductivity region 103, the fifth conductivity region 105, the seventh conductivity region 107 and the collector region 121. The first current path is turned on when subject to a voltage level above a threshold level; the second current path is turned on subsequently following the first current path is turned on; and the third current path is turned on subsequently following the second current path is turned on. Details will be discussed further in the following description.

Figure 3:
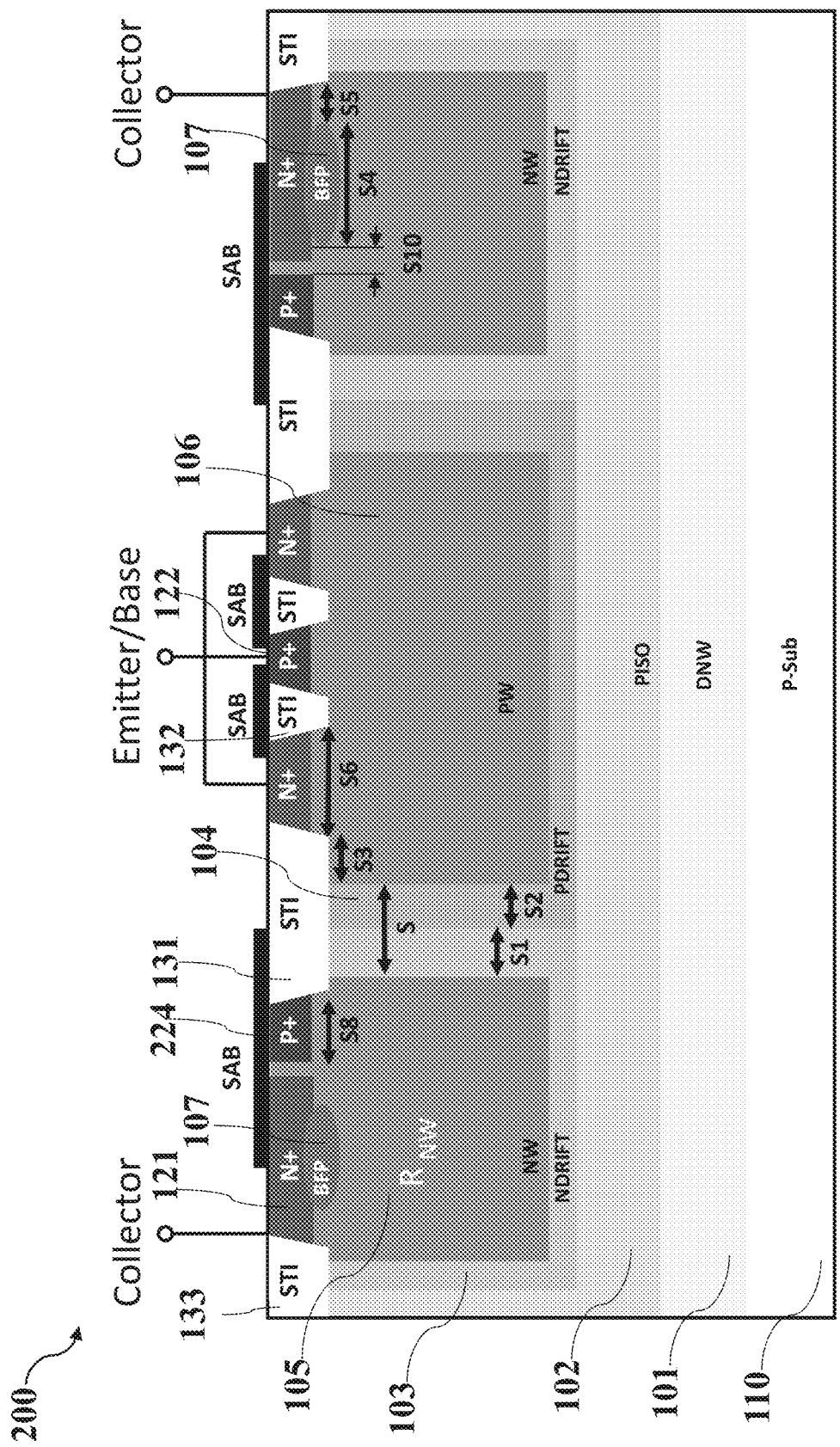
FIG. 3 shows a cross-sectional view of a device for ESD protection according to an embodiment of the present disclosure.

Now referring to FIG. 3, a device 200 is presented according to an alternative non-limiting embodiment. The device 200 may include the features of the device 100 as described above in connection to FIG. 1, and therefore, the common features are labelled with the same reference numerals and need not be discussed. The device 200 may further include a first terminal region 224. The first terminal region 224 may be a floating p-doped conductivity island. The first terminal region 224 is provided between the collector region 121 and the first isolation region 131, and below the SAB layer 161. The distance between one end of the seventh conductivity region 107 and the edge of the first terminal region 224 is denoted as $S_{10}$ in FIG. 3. The distance $S_{10}$ may modulate the electrical characteristics of the device 200 in the same way that the distance $S_7$ modulates the device 100 as described below. The distance between the point of the trapezoid of the first isolation region 131 disposed in the fifth conductivity region 105 and the edge of the first terminal region 224 is denoted as $S_8$ in FIG. 3. The first terminal region 224 is positioned between the seventh conductivity region 107 which is disposed at the collector side and the first isolation region 131 which is a C-E STI, and this arrangement weakens and/or prevents parasitic lateral SCR (lateral NPN $Q_1$ and lateral PNP $Q_2$) action for achieving high holding voltage.

Figure 4:
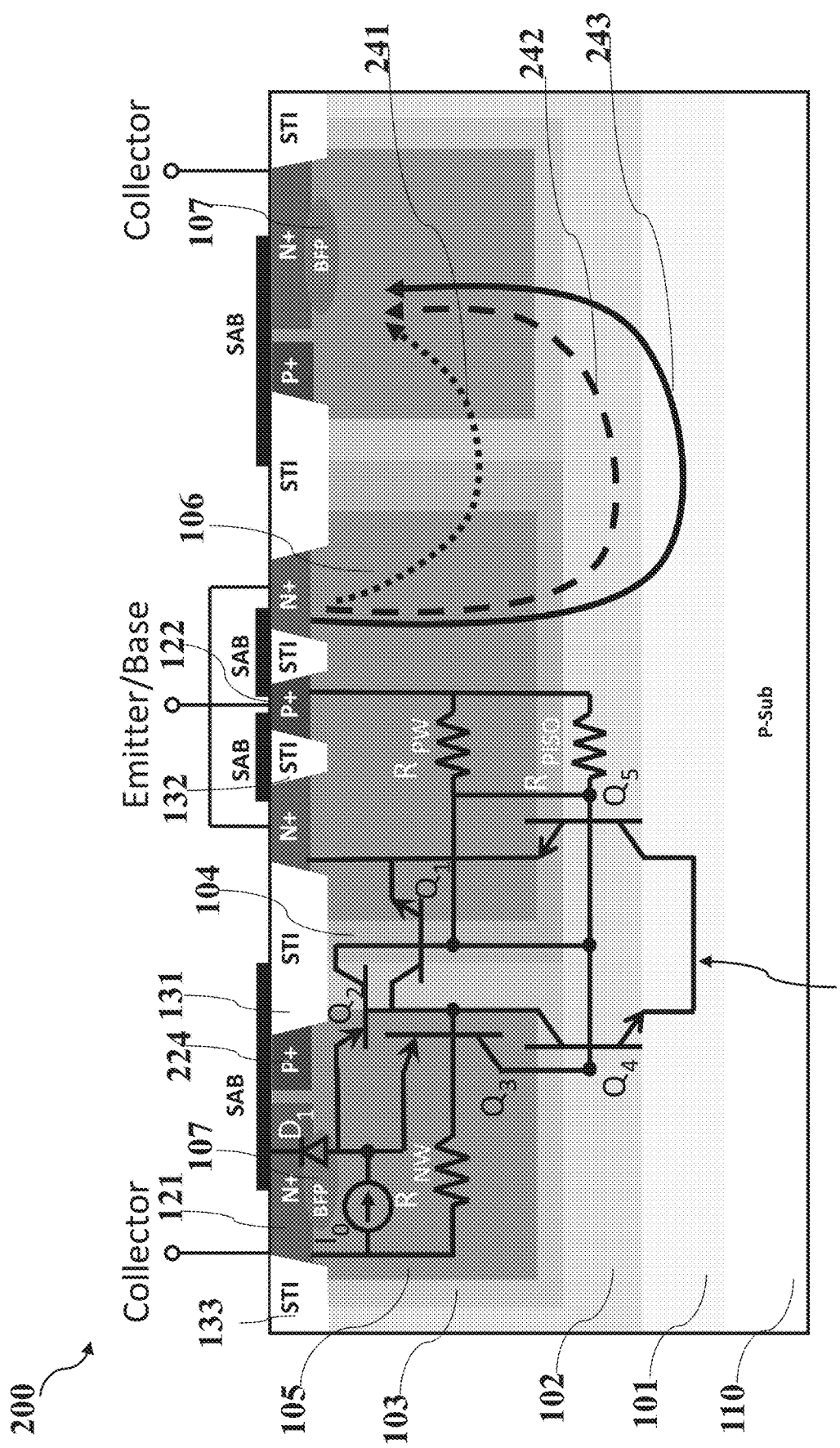
FIG. 4 shows an equivalent circuit of the device of FIG. 3.

FIG. 4 shows an equivalent circuit 240 of the device 200. Current paths 241, 242 and 243 as shown can be formed.

Figure 5:
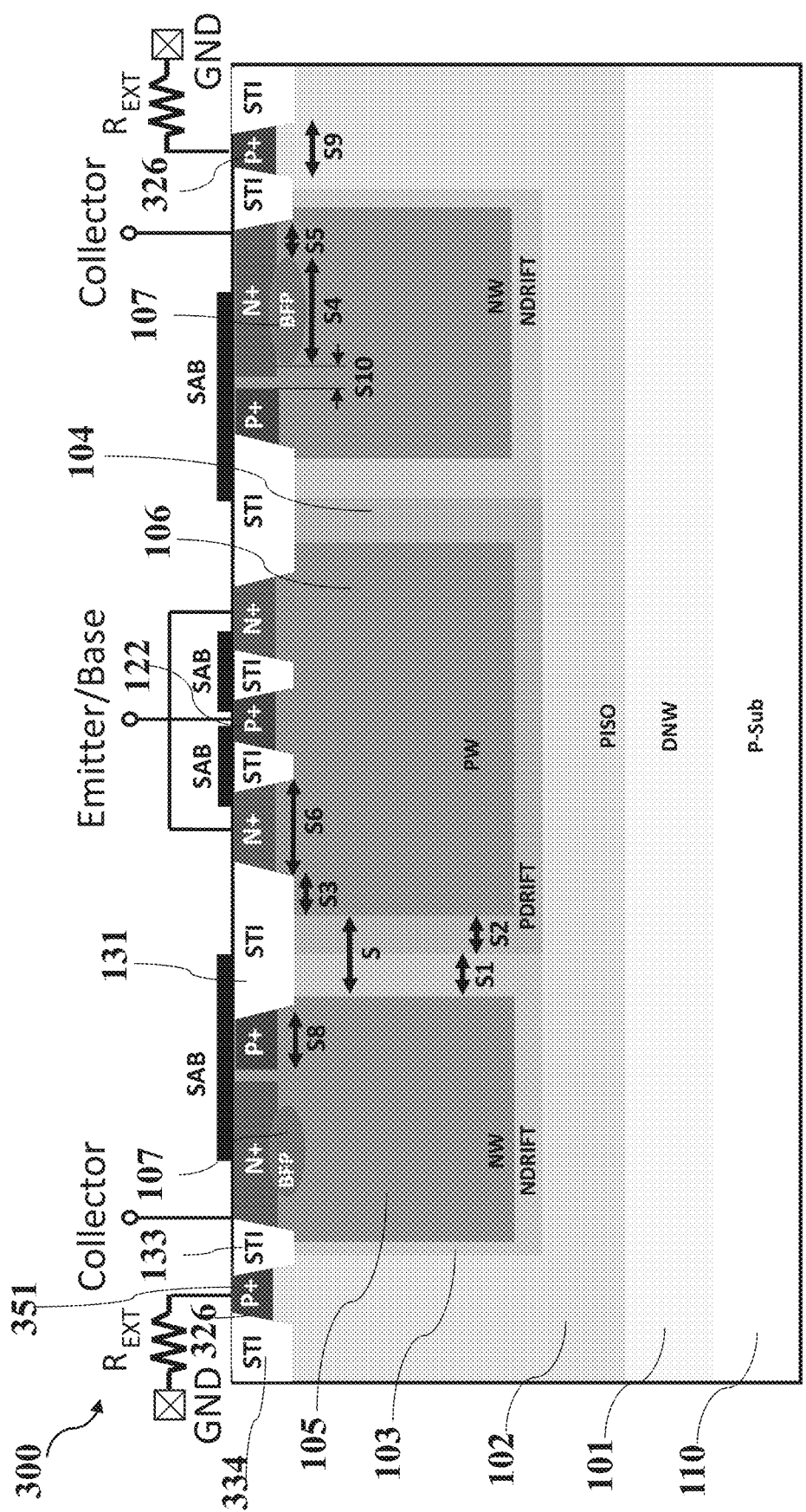
FIG. 5 shows a cross-sectional view of a device for ESD protection according to an embodiment of the present disclosure.

Now referring to FIG. 5, a device 300 is presented according to an alternative non-limiting embodiment. The device 300 may include the features of the device 100 and the device 200 as described above in connection to FIG. 1 and FIG. 2, and therefore, the common features are labelled with the same reference numerals and need not be discussed. The device 300 may further include a fourth isolation region 334 disposed in the second conductivity region. The fourth isolation region 334 may also be STI or LOCOS region. The device 300 may further include a second terminal region 326 disposed between the third isolation region 133 and the fourth isolation region 334. The distance between the point of the trapezoid of the third isolation region 133 disposed in the second conductivity region 102 and a point of the trapezoid of the fourth isolation region 334 disposed in the second conductivity region 102 is denoted as $S_9$ in FIG. 5. The device 300 may further include a metal component 351 provided on the second terminal region 326 and connected in series with a resistor to ground. In other words, the metal component 351 is through a series resistance to ground. The metal component 351 is provided for faster parasitic vertical NPN 345 ($Q_5$) and vertical SCR 344 ($Q_3$ and $Q_4$) triggering at high transmission line pulse (TLP) current.

Figure 6:
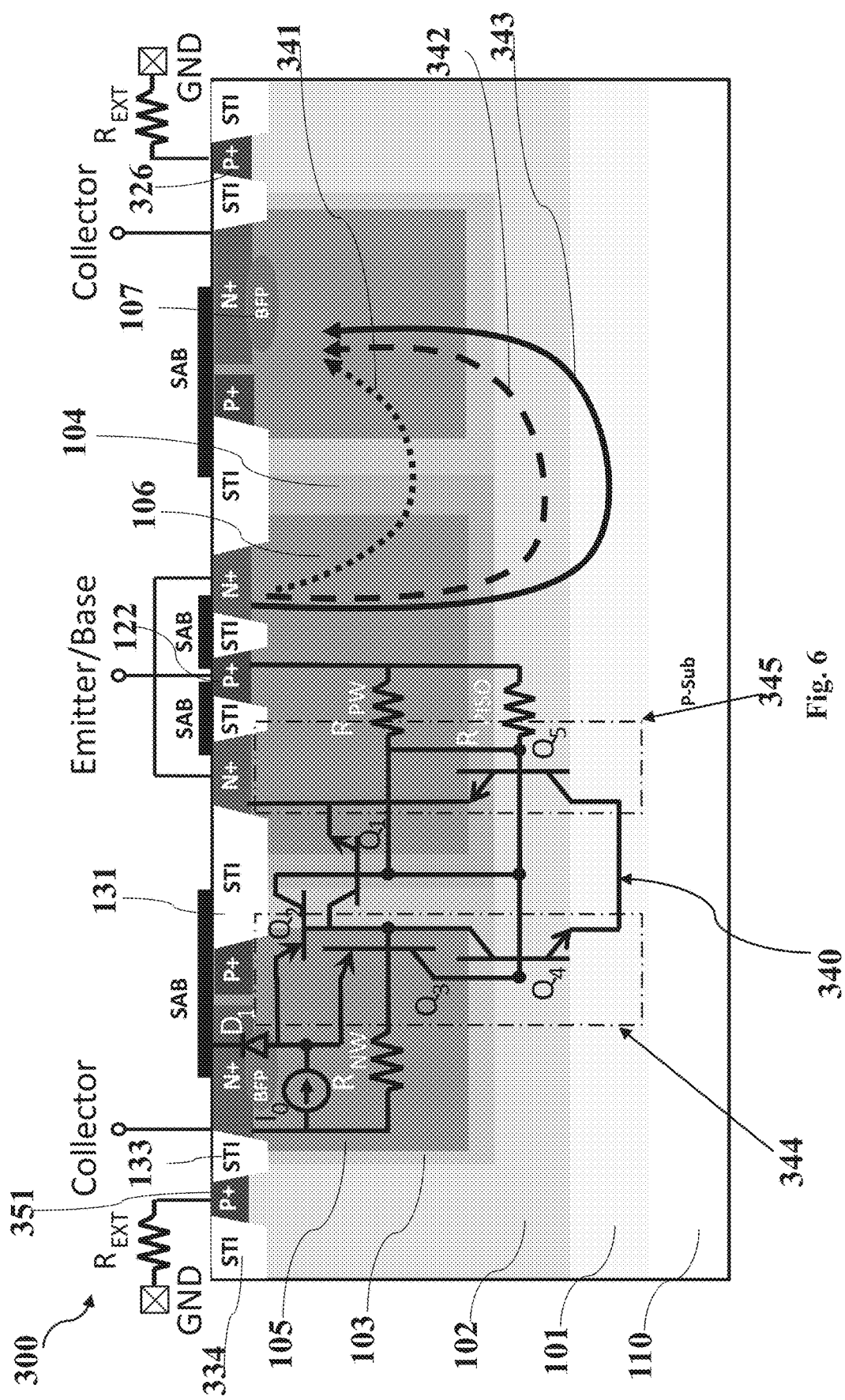
FIG. 6 shows an equivalent circuit of the device of FIG. 5.

FIG. 6 shows an equivalent circuit 340 of the device 300. Current paths 341, 342 and 343 as shown can be formed.

Figure 7:
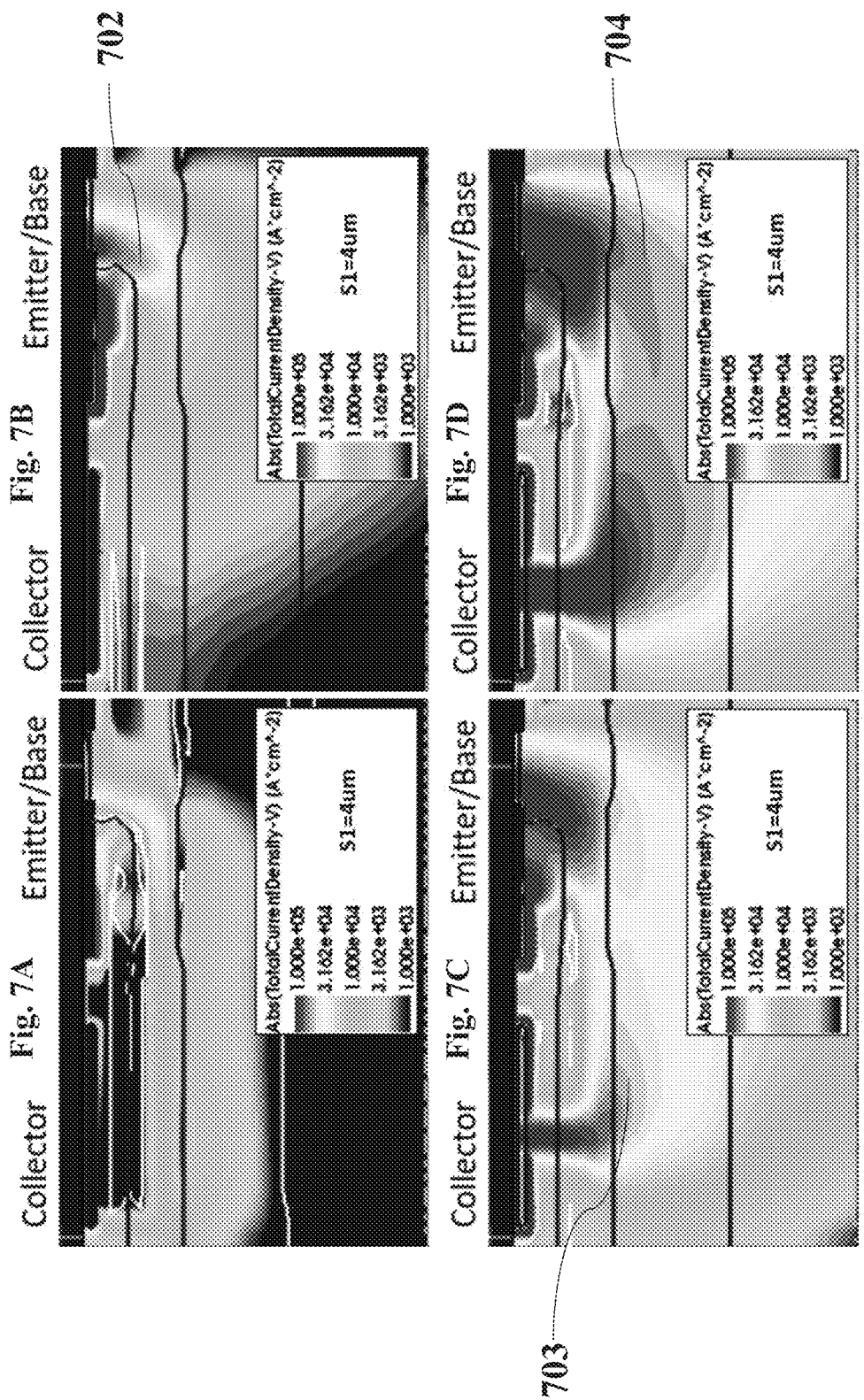
FIGS. 7A-7D show simulated total current densities for the device of FIG. 1 in technology computer aided design (TCAD)
Figure 8:
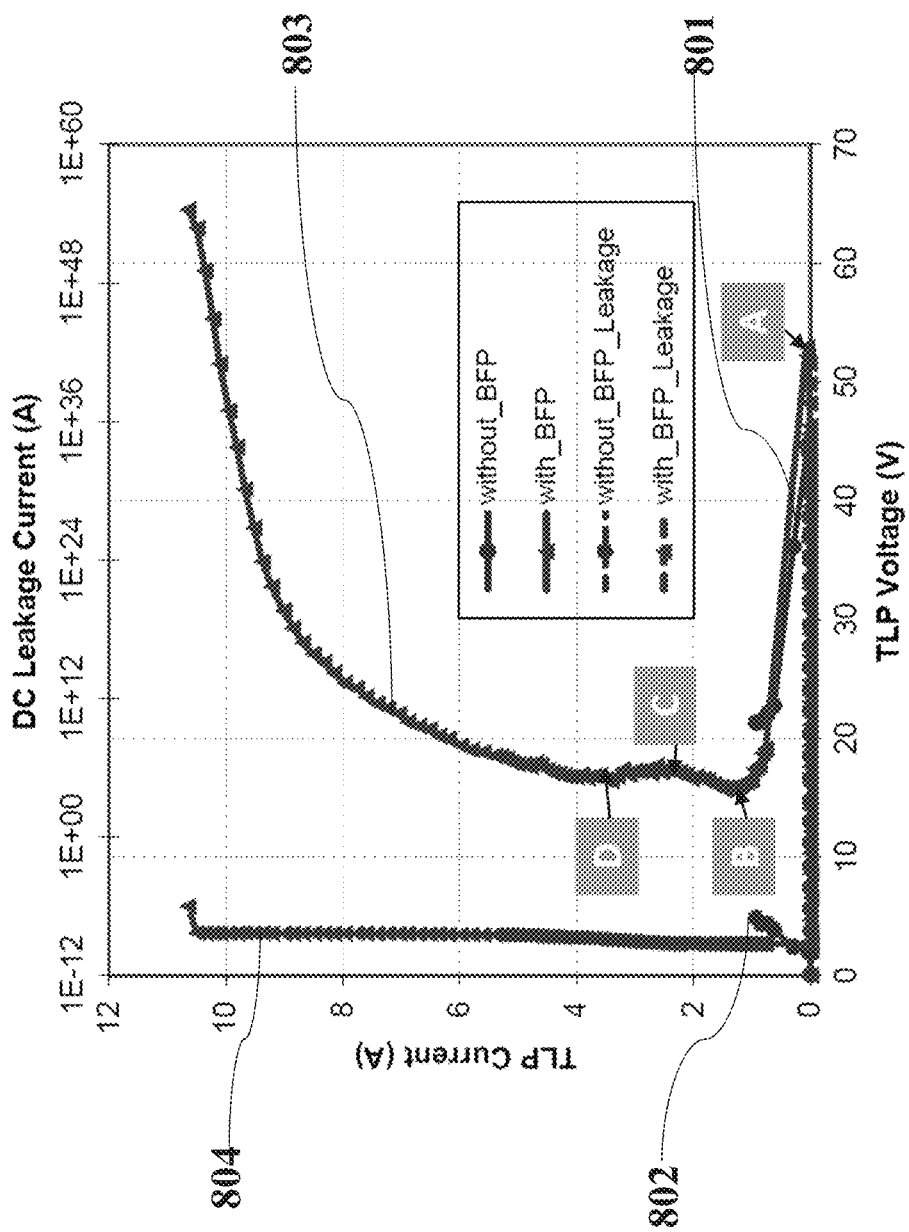
FIG. 8 shows 100 ns silicon measured transmission line pulse (TLP) results of the device of FIG. 1.

The operation of the device 100 is now described in connection with FIGS. 7A-7D and FIG. 8. FIGS. 7A-7D show simulated total current densities for the device of FIG. 1 in technology computer aided design (TCAD). FIG. 8 shows 100 ns silicon measured transmission line pulse (TLP) results of the device of FIG. 1. Graph 803 of FIG. 8 shows the 100 ns TLP current through the device 100 against the electrostatic discharge voltage applied to the device 100; graph 804 shows the DC leakage current of the device 100. For comparison, graph 801 of FIG. 8 shows the 100 ns TLP current through a compared device without a buried floating p-doped conductivity region similar to the seventh conductivity region 107 of the device 100, against the electrostatic discharge voltage applied to the compared device; graph 802 shows the DC leakage current of the compared device. In use, the emitter region 123 and the base region 122 may be shorted to a common voltage and the collector region 121 may be electrically connected to a point of electrostatic discharge. When the electrostatic discharge level is exceeding a threshold level, the reverse voltage between the base region 122 and the collector region 121 is increasing above a breakdown level, as shown in FIG. 7A and Point A of FIG. 8. Point A of FIG. 8 is considered as the trigger point, also as the breakdown voltage of device 100. The trigger voltage and the breakdown voltage are used herein interchangeably. This causes the junction between the third conductivity region 103 and the fourth conductivity region 104 to break down and the parasitic bipolar transistors $Q_1$ (NPN) and $Q_2$ (PNP) to turn on as shown in FIG. 7B and Point B of FIG.

8. A first discharge current passes through the first current path 141. The total current density gradients 702 are present at the emitter side as shown in FIG. 7B. The first electrostatic discharge current path is considered as shallow and weak. The avalanche injection may further cause the parasitic bipolar transistor $Q_3$ (PNP) to turn on. A second discharge current passes through the second current path 142 as shown in FIG. 7C and Point C of FIG. 8. The intensive contours of total current density 703 are present from the emitter side to the collector side as shown in FIG. 7C, indicating the second current path 142 is formed. The second discharge current path is considered as deep and strong in relative to the first discharge current. The transistors Q4 and Q5 may be subsequently turned on as the junction between the first conductivity region 101 and the second conductivity region 102 is broken down at higher TLP current levels. A third discharge current passes through the third current path 143 as shown as FIG. 7D and Point D of FIG. 8. The more intensive contours of electron current density 704 are present from the emitter side to the collector side as shown in FIG. 7D, indicating the third current path 143 is formed. The third discharge current path is U-shaped, relatively deeper and vertical and considered as dominant in relative to the first discharge current and the second discharge current paths. It is worth noting that 'first discharge current', 'second discharge current' and 'third discharge current' are not used herein to describe one current occurring right after the other; although, the 'second discharge current' may occur after the 'first discharge current' and the 'third discharge current' may occur after the 'second discharge current' and all the discharge paths can co-exist concurrently once the 'third discharge current' path has been activated and the BFP NPN-eSCR device has fully turned on. Such terms are used to distinguish the relative ESD discharge path depths, strengths and directions for the three currents, i.e. the first discharge current flows in a certain direction along a particular path that is different from the direction and path of the second discharge current and the direction and path of the third discharge current.

The device 100 may be considered fully turned on when the transistors $Q_1$ to $Q_5$ are all turned on, or in other words, when the first, second and third current paths 141, 142, 143 all flow through the device 100. The first, second and third discharge currents may be respectively referred to as the first, second and third snapback currents. The unique stage-by-stage turn-on of the snapback currents can enhance the overall ESD robustness and reduce the on-resistance of the device 100. Furthermore, a higher normalized failure current It2 (about 87.44 mA/um) can be achieved or in other words, a smaller footprint at the same It2 level can be obtained. The absolute failure current It2 (about 10.49 A) for a single finger can be scaled with the number of fingers to 30A and this complies with IEC 61000-4-2 standard for Robust Automotive Grade HV ESD protection performance requirement, as evident from the 100 ns TLP I-V characteristic depicted in graph 803 of FIG. 8.

A stage-by-stage turn-on mechanism is provided by the present buried floating p-doped (BFP) NPN embedded-SCR (NPN-eSCR) of the device 100. The broad U-shaped deep vertical ESD current discharge path is provided by the operation mechanism of BFP NPN embedded-SCR (NPN-eSCR) device 100. The distinctive parasitic PNPNPN action of device 100 is provided with series connected parasitic vertical SCR and parasitic vertical NPN. Diode $D_1$ completes parasitic N+/PNPNPN ESD current conduction path from the collector to the emitter.

Various modifications can be made to the device 100 as described herein. Similar modifications as those described with reference to device 100 may be made to devices 200, 300.

Figure 9:
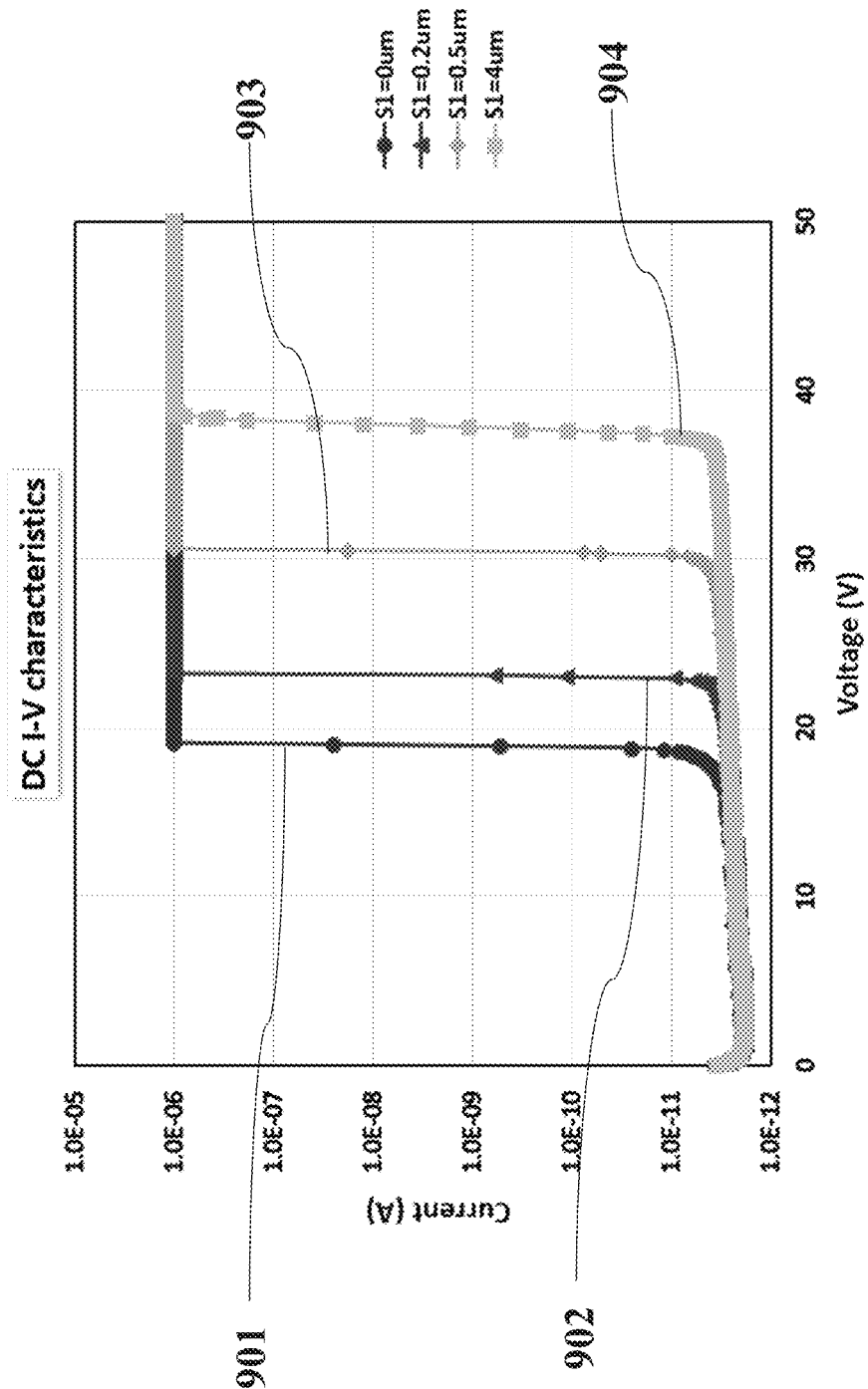
FIG. 9 shows the DC current-voltage characteristics of the device of FIG. 1.
Figure 10:
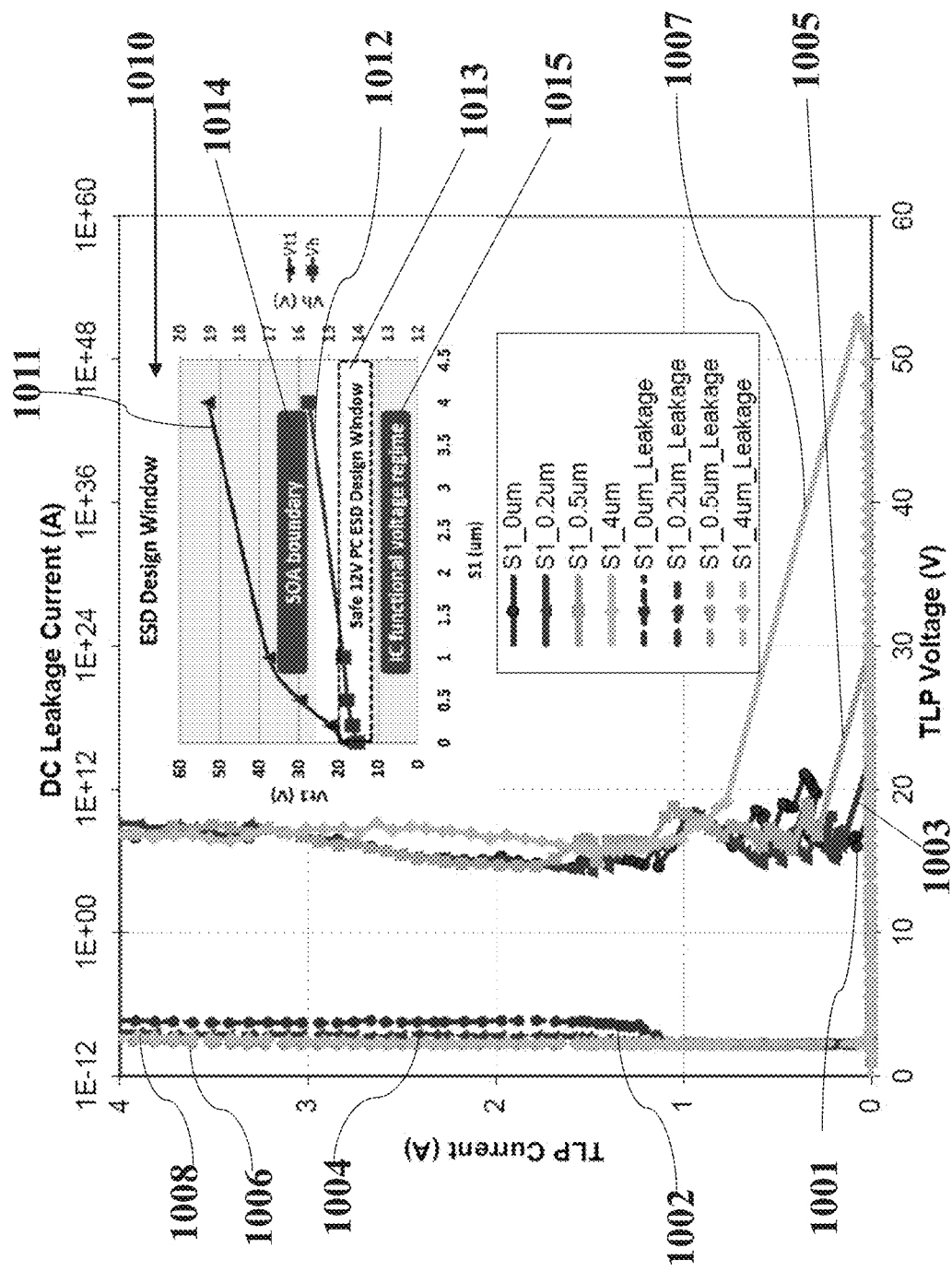
FIG. 10 shows 100 ns silicon measured TLP results of the device of FIG. 1.

For example, the distance $S_1$ between the fifth conductivity region 105 and the boundary of the third conductivity regions 103 and the distance $S_2$ between the sixth conductivity region 106 and the boundary of the fourth region 104 as shown in FIG. 1 may be varied. By varying these distances, the breakdown voltage of the device 100 can be adjusted to a desired level. FIG. 9 shows how the DC current-voltage (I-V) characteristics of the device 100 change when $S_1$ changes. FIG. 10 shows 100 ns Silicon measured transmission line pulse (TLP) results with respect to various distance $S_1$. In particular, FIG. 9 shows graphs 901, 902, 903, 904 of the currents through the device 100 against the DC voltage applied to the device 100 when $S_1=0$ um (i.e. when the boundary of the fifth conductivity region 105 is in direct contact with the boundary of the third conductivity region 103), when $S_1=0.2$ um, when $S_1=0.5$ um and when $S_1=4$ um, respectively. FIG. 10 shows graphs 1001, 1003, 1005, 1007 of the 100 ns TLP currents through the device 100 against the electrostatic discharge voltage applied to the device 100, and graphs 1002, 1004, 1006, 1008 of the DC leakage currents of the device 100, when $S_1=0$ um (i.e. when the boundary of the fifth conductivity region 105 is in contact with the boundary of the third conductivity region 103), when $S_1=0.2$ um, when $S_1=0.5$ um and when $S_1=4$ um, respectively. The inset of FIG. 10 shows ESD Design Window 1010 with graphs 1011, 1012 depicting respectively the breakdown voltage or trigger voltage Vt1 and the holding voltage Vh of the device 100 against the distance $S_1$. The inset of FIG. 10 also shows a safe 12V ESD design window 1013 between safe operating area (SOA) boundary 1014 and IC functional voltage regime 1015.

The variation of $S_1$ varies the breakdown voltage with greater $S_1$ resulting in higher breakdown voltage. By reducing the distance $S_1$, the breakdown voltage or trigger voltage and the holding voltage of the device 100 can be reduced. Reducing the distance $S_1$ can also reduce the voltage gap between the breakdown voltage or trigger voltage and the holding voltage of the device 100. The device 100 provides scalable trigger voltage (Vt1 is adjustable from about 18V to about 52V) for high voltage I/O protection and high holding voltage (Vh is above 12V) suitable for high voltage power rail (12V) protection when $S_1=0$ um. The device 100 also provides optimized device footprint (square layout) with each emitter edge of about 30 um for offering area-efficient high voltage ESD solution. Moreover, the distance $S_1$, $S_2$ are shown in FIG. 1 as uniformly extending from the isolation region 131 to the second conductivity region 102, but they may be varying, i.e. the vertical boundary of the fifth conductivity region 105 is spaced apart from the vertical boundary of the third conductivity region 103 at a varying distance and the vertical boundary of the sixth conductivity region 106 is spaced apart from the vertical boundary of the fourth conductivity region 104 at a varying distance.

Figure 11:
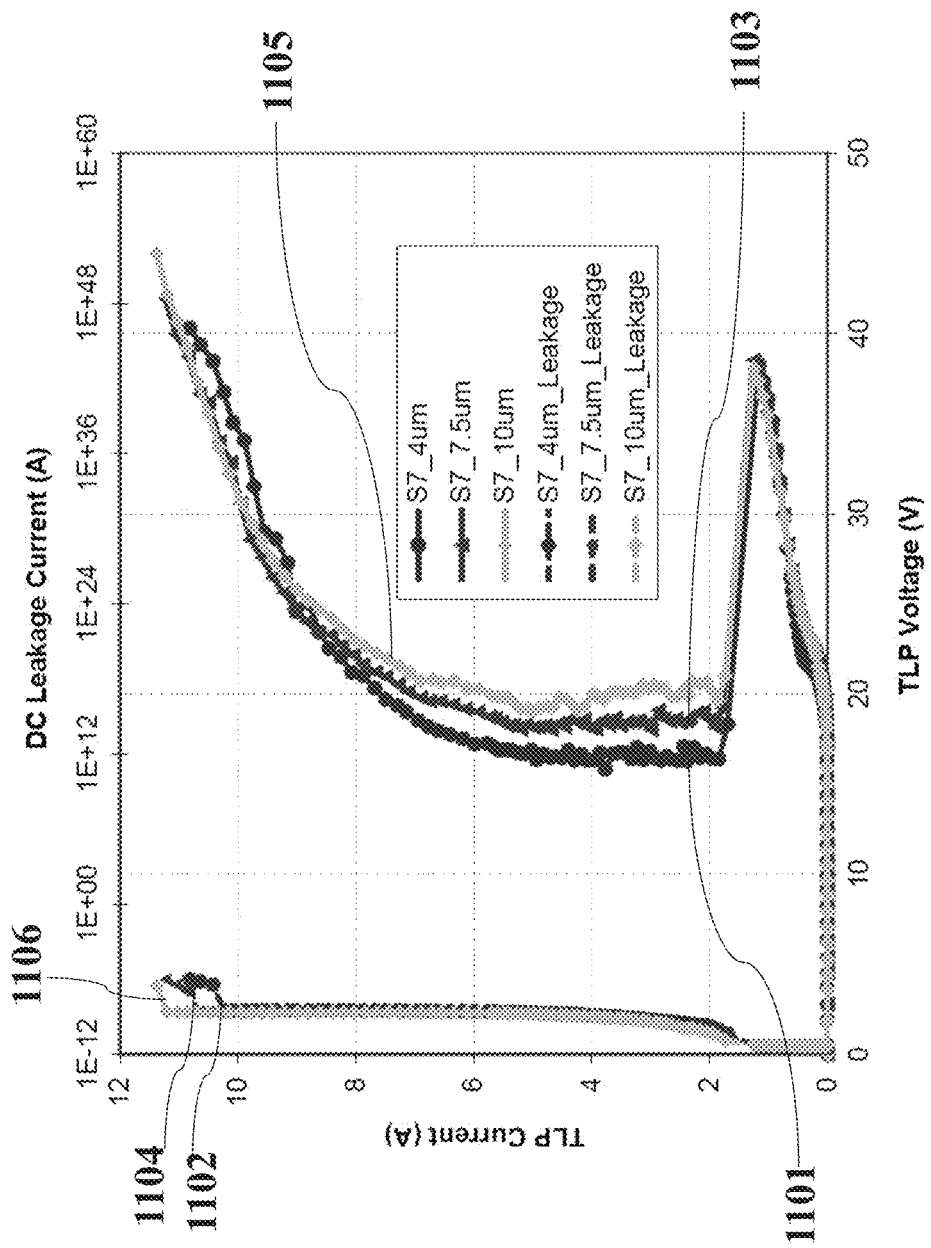
FIG. 11 shows 100 ns silicon measured TLP results of the device of FIG. 1.

Further, the distance $S_7$ from one end of the seventh conductivity region 107 to the point of the trapezoid of the first isolation 131 disposed in the fifth conductivity region 105 may be varied. FIG. 11 shows 100 ns Silicon measured TLP results with respect to various distance $S_7$, including graph 1101 when $S_7=4$ um, graph 1103 when $S_7=7.5$ um and graph 1105 when $S_7=10$ um. FIG. 11 also shows graphs 1102, 1104, 1106 of the DC leakage currents of device 100 when $S_7=4$ um, 7.5 um and 10 um, respectively. As shown in FIG. 11, by increasing the distance $S_7$, the holding voltage of the device 100 can be increased. The first terminal region 224 is provided to weaken and/or prevent parasitic lateral SCR (parasitic lateral NPN $Q_1$ and lateral PNP $Q_2$) action, thereby achieving even higher holding voltage. Higher holding voltage is preferred to avoid latch-up.

Figure 12:
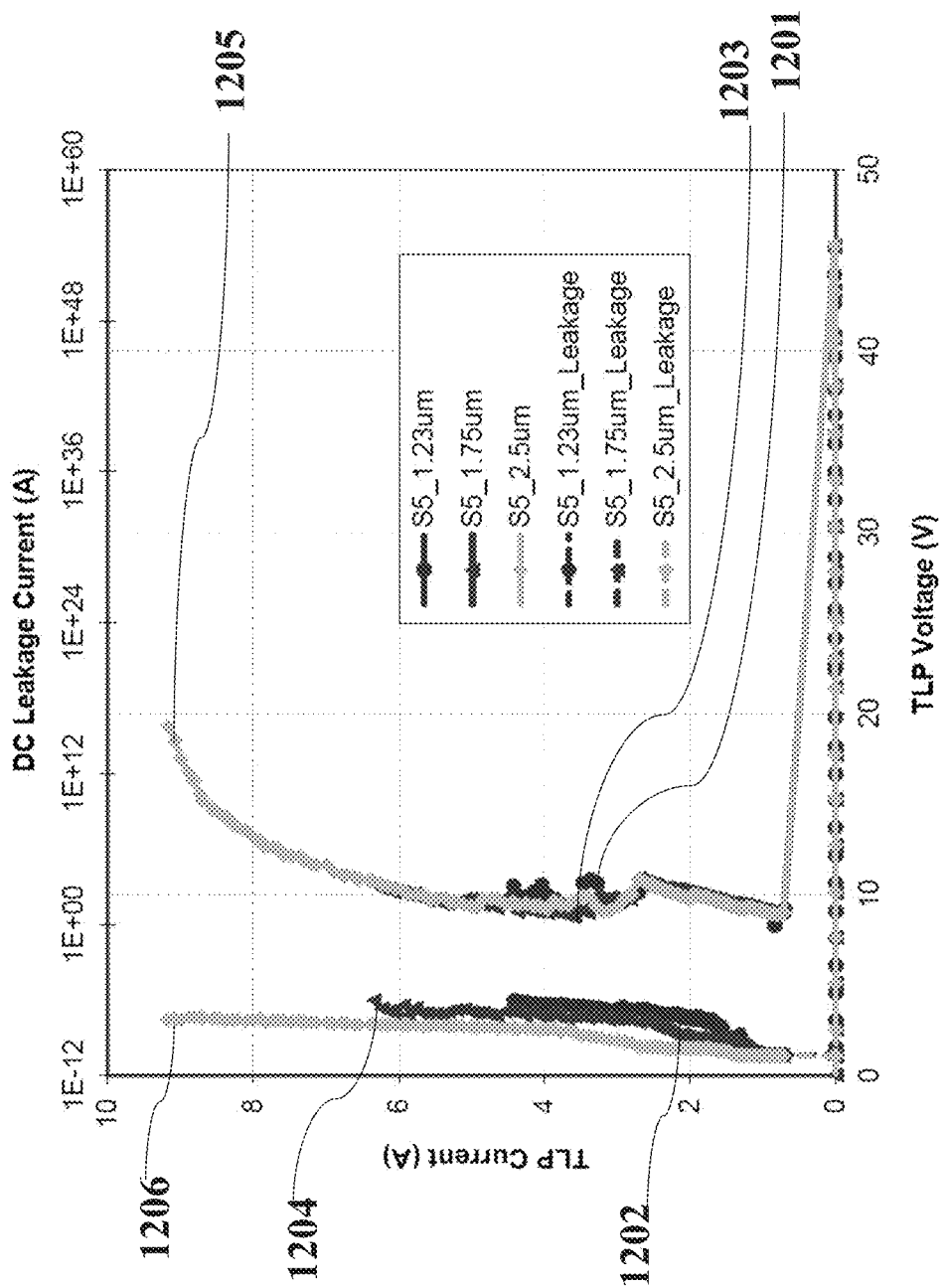
FIG. 12 shows 100 ns silicon measured TLP results of the device of FIG. 1.

The distance $S_5$ is defined as from one end of the seventh conductivity region 107 to the point of the trapezoid of the third isolation region 133 disposed in the fifth conductivity region 105 and may be varied. FIG. 12 shows 100 ns Silicon measured TLP results with respect to various distance $S_5$, including graph 1201 when $S_5$=1.23 um, graph 1203 when $S_5$=1.75 um and graph 1205 when $S_5$=2.5 um. FIG. 12 also shows graphs 1202, 1204, 1206 of the DC leakage currents when $S_5$=1.23 um, 1.75 um and 2.5 um, respectively. As shown in FIG. 12, by increasing the distance $S_5$, the failure current It2 of the device 100 can be increased, thereby optimizing the ESD robustness performance of the device 100.

Further, the distances $S_2$, $S_3$, $S_4$, $S_6$, $S_8$, $S_9$ and $S_{10}$ may be varied, and the electrical characteristics and performance of the devices 100, 200, 300 may be varied accordingly. The distances $S_1$-$S_{10}$ may vary from 0 to 16 um; and the widths of the collector 121, the emitter 123 and the seventh conductivity region 107 may vary from 0 to 16 um. It is not intended that the distances $S_1$ to $S_{10}$ are limited to lateral distances as shown in the Figures, and these distances may be defined in a way that a person skilled in the art would understand in view of the description herein, for example, a distance between two points of two regions.

In a non-limiting embodiment, the first conductivity region 101, the third conductivity region 103, the fifth conductivity region 105, the collector region 121 and the emitter region 123 may have a first conductivity type; the second conductivity region 102, the fourth conductivity region 104, the sixth conductivity region 106, the seventh conductivity region 107 and the base region 122 may have a second conductivity type; and the first conductivity type is different from the second conductivity type. In FIG. 1, the first conductivity region 101, the third conductivity region 103, the fifth conductivity region 105, the collector region 121 and the emitter region 123 are shown as n-doped conductivity; and the second conductivity region 102, the fourth conductivity region 104, the sixth conductivity region 106, the seventh conductivity region 107 and the base region 122 are shown as p-doped conductivity. It can be understood by a person skilled in the art that the first conductivity region 101, the third conductivity region 103, the fifth conductivity region 105, the collector region 121 and the emitter region 123 can have a different conductivity or an opposite conductivity, e.g. p-doped conductivity; and that the second conductivity region 102, the fourth conductivity region 104, the sixth conductivity region 106, the seventh conductivity region 107 and the base region 122 can have a different conductivity, e.g. n-doped conductivity. The first terminal region 224 is shown as p-doped conductivity region in FIG. 3, and it can be understood that the first terminal region 224 can be a different conductivity as discussed herein. Similarly, the second terminal region 326 is shown as p-doped conductivity region in FIG. 5, and it can be understood that the second terminal region 326 can be a different conductivity as discussed herein. The device 100 may also be modified such that only some regions are replaced with respective regions of an opposite conductivity type. For instance, the substrate 110 can be replaced with an n-type substrate, while the conductivity type of the rest of the device 100 remains the same. It would be clear to a person skilled in the art that the directions of current flows will change accordingly when the conductivity types of the various regions are reversed.

In a non-limiting embodiment, the collector region 121 and the emitter region 123, or combinations thereof may include one or more dopants and may have the same doping concentrations (i.e. same concentration of dopants) or different doping concentrations (i.e. different concentrations of dopants) from each other. The third conductivity region 103 and the fourth conductivity region 104 may have the same doping concentration, and the fifth conductivity region 105 and sixth conductivity 106 may have the same doping concentration. The doping concentration of the seventh conductivity region 107 is greater than the doping concentration of the sixth conductivity region 106, and the doping concentration of the sixth conductivity region 106 is greater than the doping concentration of the fourth conductivity region 104, and the doping concentration of the fourth conductivity region 104 is greater than the doping of the second conductivity region 102. The doping concentration of the fifth conductivity region 105 is greater than the doping concentration of the third conductivity region 103, and the doping concentration of the third conductivity region 103 is greater than the doping concentration of the first conductivity region 101.

The doping levels of the various conductivity regions may be varied, the electrical characteristics and performance of the device 100 as described herein will be varied accordingly.

Furthermore, the positioning of the regions of the device 100, 200, 300 may be varied. For instance, the third conductivity region 103 and fourth conductivity region 104 may be positioned anywhere between the collector region 121, the emitter region 123 and the second conductivity region 102, as long as at least a part of the third conductivity region 103 remains coupled with a part of the fourth conductivity region 104. For example, at least a part of the third conductivity region 103 may be in direct contact with a part of the fourth conductivity region 104 or are not in direct contact but separated by only a spacing. The third conductivity region 103 may not be in contact with the fourth conductivity region 104 along the vertical boundaries, but instead, along a part of slanted boundaries as the case may be. Moreover, the contacted boundaries between the third conductivity region 103 and the fourth conductivity region 104 may not be straight lines in a cross-sectional view or a flat surface. Similarly, the fifth conductivity region 105 may be disposed in a different position in the third conductivity region 103 and the sixth conductivity region 106 may be disposed in a different position in the fourth conductivity region 104.

In fact, the seventh conductivity region 107 also need not be disposed partially within both the fifth conductivity region 105 and the collector region 121 as shown in FIG. 1. Instead, the seventh conductivity region 107 may be disposed within only the fifth conductivity region 105, or within only the collector region 121. The cross-sectional view of the seventh conductivity 107 is shown as an oval; however, it can be understood by a person skilled in the art that the shape and size can be adjusted with respect to the electrical requirements of the devices. The distances $S_4$, $S_5$, $S_7$, $S_{10}$ are defined herein with reference to the seventh conductivity region 107, and the way of defining the distances $S_4$, $S_5$, $S_7$, $S_{10}$ will be adapted according to the respective shape and this adaption is apparent in view of the discussion in the description.

The isolation regions 131, 132, 133, 334 may be positioned differently. The cross-sectional view of the isolation regions 131, 132, 133, 334 may be any shape other than trapezoid. The size of the isolation regions 131, 132, 133, 334 may be adjusted to be less or larger in the lateral direction or in the vertical direction. The distances $S_3, S_5, S_6, S_8$ to $S_{10}$ are defined herein with reference to, for example, a point of a trapezoid of one isolation region. It can be understood by a person skilled in the art in the event that the cross-section view of the isolation regions 131, 132, 133, 334 is not trapezoidal, the way of defining the distances $S_1$ to $S_{10}$ will be adapted according to the respective shape and this adaption is apparent in view of the discussion in the description.

Further, each salicide block layer 161, 162 may fully overlap with the respective collector region 121, the emitter region 123, and the base region 122 in a non-limiting embodiment. Depending on the orientation of the devices 100, 200, 300 each salicide block layer 161, 162 may be either above or below the respective collector region 121, the emitter region 123, and the base region 122.

In addition, the surfaces of the devices 100, 200, 300 are not intended to limit to flat surfaces. In a non-limiting embodiment, the surfaces of the devices 100, 200, 300 can be curved surfaces.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

The invention claimed is:

1. A device comprising:
   a first region;
   a second region disposed on the first region;
   a third region and a fourth region disposed in the second region, wherein the third region abuts the fourth region;
   a fifth region disposed in the third region and a sixth region disposed in the fourth region;
   a collector region disposed over and coupled to the fifth region;
   an emitter region disposed over and coupled to the sixth region;
   a first isolation region disposed between the collector region and the emitter region;
   and
   a seventh region disposed in the fifth region and coupled to the collector region, wherein the seventh region is spaced apart from the first isolation region,
   wherein the first region, the third region, the fifth region, the collector region and the emitter region have a first conductivity type; wherein the second region, the fourth region, the sixth region, and the seventh region have a second conductivity type; and wherein the first conductivity type is different from the second conductivity type.

2. The device according to claim 1, wherein the first isolation extends across and over the fifth region, the third region, the fourth region and the sixth region.

3. The device according to claim 2, further comprising a second isolation region abutting the collector region and disposed across and over the second region, the third region and the fifth region.

4. The device according to claim 3, wherein the seventh region is configured to be spaced apart from the second isolation region.

5. The device according to claim 3, wherein the second isolation region abutting the collector region comprising the second isolation region in direct contact with the collector region.

6. The device according to claim 1, wherein a first terminal region having the second conductivity type is provided over the fifth region and is positioned between the collector region and the first isolation region, the first terminal region being configured to be spaced apart from the collector region and to abut the first isolation region.

7. The device according to claim 6, wherein the seventh region is spaced apart from the first terminal region.

8. The device according to claim 6, wherein the first terminal region being configured to abut the first isolation region comprises the first terminal region being configured to be in direct contact with the first isolation region.

9. The device according to claim 6, further comprising a salicide block layer disposed over the collector region, the fifth region, the first terminal region and the first isolation region.

10. The device according to claim 3, further comprising a third isolation region disposed over the second region; and
   a second terminal region having the second conductivity type disposed between the second isolation region and the third isolation region, and disposed in the second region,
   wherein a metal component is provided on the second terminal region and connected through a series resistance to ground.

11. The device according to claim 1, further comprising a base region disposed over and in direct contact with the sixth region, and a fourth isolation region disposed over the sixth region and positioned between the emitter region and the base region, and the fourth isolation region is spaced apart from the first isolation region.

12. The device according to claim 1, wherein the third region abutting the fourth region comprises the third region in direct contact with the fourth region; and wherein the collector region coupled to the fifth region comprises the collector region in direct contact with the fifth region, the emitter region coupled to the sixth region comprises the emitter region in direct contact with the sixth region, and the seventh region coupled to the collector region comprises the seventh region in direct contact with the collector region.

13. The device according to claim 1, wherein a doping concentration of the seventh region is greater than a doping concentration of the sixth region, and the doping concentration of the sixth region is greater than a doping concentration of the fourth region, and the doping concentration of the fourth region is greater than a doping of the second region; and
   wherein a doping concentration of the fifth region is greater than a doping concentration of the third region, and the doping concentration of the third region is greater than a doping concentration of the first region.

14. The device according to claim 1, wherein the fifth region is disposed away from a boundary between the third region and the fourth region, and the sixth region is disposed away from the boundary between the third region and the fourth region.

15. The device according to claim 1, wherein the first conductivity type is opposite to the second conductivity type.

16. The device according to claim 1, wherein the first region is a well region; and wherein the second region is a doped isolation layer, extending continuously over the first region.

17. The device according to claim 1, wherein the third region and the fourth region are drift regions.

18. The device according to claim 1, wherein the third region is disposed at a substantially same depth at which the fourth region is disposed in the second region, and/or wherein the fifth region is disposed in the third region at a substantially same depth at which the sixth region is disposed in the fourth region.

19. A method for manufacturing a device, comprising:
providing a first region on a substrate;
providing a second region on the first region;
providing a third region and a fourth region in the second region, wherein the third region abuts the fourth region;
providing a fifth region disposed in the third region;
providing a sixth region disposed in the fourth region;
providing a seventh region disposed in the fifth region;
providing a collector region over and coupled with the fifth region and the seventh region;
providing an emitter region and a base region over and coupled with the sixth region;
providing a first isolation region between the collector region and the emitter region, extending across over the fifth region, the third region, the fourth region and the sixth region; and
providing a second isolation region between the emitter region and the base region,
wherein the seventh region is configured to be spaced apart from the first isolation region; and
wherein the first region, the third region, the fifth region, the collector region and the emitter region have a first conductivity type; wherein the second region, the fourth region, the sixth region, the base region and the seventh region have a second conductivity type; and wherein the first conductivity type is different from the second conductivity type.

20. The device according to claim 1, wherein the third region abutting the fourth region comprises the third region in direct contact with the fourth region.

* * * * *